(12) United States Patent
Dunham et al.

(10) Patent No.: US 7,703,060 B2
(45) Date of Patent: Apr. 20, 2010

(54) STITCHED IC LAYOUT METHODS, SYSTEMS AND PROGRAM PRODUCT

(75) Inventors: Timothy G. Dunham, South Burlington, VT (US); Robert K. Leidy, Burlington, VT (US); Kevin N. Ogg, Burlington, VT (US); Richard J. Rassel, Colchester, VT (US); Valarmathi C. Shanmugam, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 515 days.

(21) Appl. No.: 11/678,069

(22) Filed: Feb. 23, 2007

(65) Prior Publication Data

US 2008/0208383 A1    Aug. 28, 2008

(51) Int. Cl.
    *G06F 17/50* (2006.01)
(52) U.S. Cl. ............................ 716/7; 716/11; 716/19
(58) Field of Classification Search ............ 716/7, 716/11, 19
    See application file for complete search history.

(56) References Cited

U.S. PATENT DOCUMENTS

| | | | |
|---|---|---|---|
| 5,301,124 A | 4/1994 | Chan et al. | |
| 5,837,557 A | 11/1998 | Fulford, Jr. et al. | |
| 6,048,785 A | 4/2000 | Fulford, Jr. et al. | |
| 6,150,840 A | 11/2000 | Patel et al. | |
| 6,194,105 B1 | 2/2001 | Shacham et al. | |
| 6,225,013 B1 | 5/2001 | Cohen et al. | |
| 6,335,635 B1 | 1/2002 | Patel et al. | |
| 6,690,076 B1 | 2/2004 | Fossum et al. | |
| 6,782,499 B2 | 8/2004 | Osada et al. | |
| 7,093,143 B2 | 8/2006 | Ito et al. | |
| 7,117,466 B2 | 10/2006 | Kalafala et al. | |
| 7,141,883 B2 | 11/2006 | Wei et al. | |
| 7,161,828 B2 | 1/2007 | Cummings et al. | |
| 2001/0026172 A1 | 10/2001 | Leenstra et al. | |

(Continued)

FOREIGN PATENT DOCUMENTS

JP    11176937 A    2/1999

OTHER PUBLICATIONS

Moore, R., "Efficient Stitching Method", IBM Technical Disclosure Bulletin (Jan. 1978), vol. 20, No. 8, pp. 3104-3105.

(Continued)

*Primary Examiner*—Sun J Lin
(74) *Attorney, Agent, or Firm*—Anthony J. Canale; Hoffman Warnick LLC (57) ABSTRACT

Stitched integrated circuit (IC) chip layout methods, systems and program products are disclosed. In one embodiment, a method includes obtaining from a first entity a circuit design for an IC chip layout that exceeds a size of a photolithography tool field at a second entity, wherein the IC chip layout includes for at least one stitched region of a plurality of stitched regions: a boundary identification identifying a boundary of the at least one stitched region at which stitching occurs and a type indicator indicating whether the at least one stitched region is one of: redundant and unique; dissecting the IC chip layout into stitched regions indicated as unique or redundant at the second entity; and generating a photolithographic reticle at the second entity based on the plurality of stitched regions, the photolithographic reticle having a size that fits within the size of the photolithographic tool field at the second entity.

16 Claims, 5 Drawing Sheets

U.S. PATENT DOCUMENTS

2005/0246116 A1  11/2005  Foreman et al.
2006/0071691 A1  4/2006  Garlepp

OTHER PUBLICATIONS

David, D., "Stitching Technique for Electron Beam Lithography System", IBM Technical Disclosure Bulletin (Oct. 1978), pp. 1875-1876.

Davis, D., "Field Stitching Method", IBM Technical Disclosure Bulletin (Jun. 1979), pp. 114-115.

Dunham et al., "Stitched IC Chip Layout Methods, Systems and Program Product," PCT/US08/54705, BUR920060204, Feb. 22, 2008, 29 pages.

Dunham et al., U.S. Appl. No. 11/849,461, BUR920060204US2, Office Action Communication, Aug. 4, 2009, 10 pages.

Chen et al., "Static Timing: Back to Our Roots", IBM Research, 7 pages.

U.S. Appl. No. 11/849,461, filed Sep. 4, 2007, Notice of Allowance dated Dec. 8, 2009.

U.S. Appl. No. 11/849,461, filed Sep. 4, 2007, Amendment to Aug. 4, 2009 Office Action, filed Nov. 4, 2009.

STITCHED IC LAYOUT METHODS, SYSTEMS AND PROGRAM PRODUCT

BACKGROUND

1. Technical Field

The disclosure relates generally to integrated circuit (IC) chip fabrication and design, and more particularly, to methods, systems and program products for stitched IC chip layouts.

2. Background Art

In the integrated circuit (IC) chip fabrication industry, circuitry is formed in a semiconductor substrate using photolithography. One challenge that faces the industry is that large circuit designs are too large to place as a whole on the reticles used in photolithography. One remedy to this issue is leveraging the redundancy within the IC chip design to break the design up into a subset of smaller unique dissected regions. When resolved in multiple regions, the dissected regions can form the completed large IC chip design on a wafer by a process commonly referred to as "stitching". Stitching includes placing the dissected IC chip (stitched) regions onto a reticle and performing multiple exposures on the wafer in order to complete the final whole IC chip image.

In terms of an IC chip fabricator (foundry), the common way of stitching a chip design is to have a customer break their own IC chip design into smaller sub-chip dissected (stitched) regions and releasing these stitched regions to the foundry to be placed on the reticle appropriately and stitched back together. The drawbacks of this approach are that it is difficult to check the design rules required of the whole IC chip and the stitched regions. In particular, appropriate design rule checks need to be performed for the whole IC chip and all of the stitched regions separately. This task falls on the customer of the foundry. In addition, stitched regions require different checks than the full IC design, which further increases the customer's burden. Further, the design rule checking required increases the release and design phases on the order of how many stitched regions the larger IC chip is dissected into. In addition, other issues beyond design rule checking may arise based on the unique issues presented by the boundaries of the stitched regions.

SUMMARY

Stitched integrated circuit (IC) chip layout methods, systems and program products are disclosed.

A first aspect of the disclosure provides a method comprising: obtaining from a first entity a circuit design for a integrated circuit (IC) chip layout that exceeds a size of a photolithography tool field at a second entity, wherein the IC chip layout includes for at least one stitched region of a plurality of stitched regions: a boundary identification identifying a boundary of the at least one stitched region at which stitching occurs and a type indicator indicating whether the at least one stitched region is one of: redundant and unique; dissecting the IC chip layout into stitched regions indicated as unique or redundant at the second entity; and generating a photolithographic reticle at the second entity based on the plurality of stitched regions, the photolithographic reticle having a size that fits within the size of the photolithographic tool field at the second entity.

A second aspect of the disclosure provides a system comprising: means for obtaining from a foundry customer a circuit design for an integrated circuit (IC) chip layout that exceeds a size of a photolithography tool field at a foundry, wherein the IC chip layout includes for at least one stitched region of a plurality of stitched regions: a boundary identification identifying a boundary of the at least one stitched region at which stitching occurs and a type indicator indicating whether the at least one stitched region is one of: redundant and unique; means for dissecting the IC chip layout into stitched regions indicated as unique or redundant at the foundry customer; and means for generating a photolithographic reticle at the second entity based on the plurality of stitched regions, the photolithographic reticle having a size that fits within the size of the photolithographic tool field at the foundry customer.

A third aspect of the disclosure provides a program product stored on a computer-readable medium, which when executed, aids in generating a photolithographic reticle, the program product comprising: program code for obtaining from a foundry customer a circuit design for an integrated circuit (IC) chip layout that exceeds a size of a photolithography tool field at a foundry, wherein the IC chip layout includes for at least one stitched region of a plurality of stitched regions: a boundary identification identifying a boundary of the at least one stitched region at which stitching occurs and a type indicator indicating whether the at least one stitched region is one of: redundant and unique; program code for dissecting the IC chip layout into stitched regions indicated as unique or redundant at the foundry customer; and program code for generating a photolithographic reticle at the second entity based on the plurality of stitched regions, the photolithographic reticle having a size that fits within the size of the photolithographic tool field at the foundry customer.

A fourth aspect of the disclosure provides a method comprising: obtaining a circuit design for a complete integrated circuit (IC) chip layout at a first entity; identifying a plurality of stitched regions of the complete IC chip layout at the first entity, the plurality of stitched regions including at least one redundant stitched region and at least one unique stitched region; and modifying the complete IC chip layout to include for each stitched region: a boundary identification identifying a boundary of the stitched region at which stitching occurs and a type indicator indicating whether the stitched region is one of: redundant and unique.

A fifth aspect of the disclosure provides a system for modifying a circuit design for a complete integrated circuit (IC) chip layout at a first entity; means for obtaining a plurality of stitched regions of the complete IC chip layout at the first entity, the plurality of stitched regions including at least one redundant stitched region and at least one unique stitched region; and means for modifying the complete IC chip layout to include for each stitched region: a boundary identification identifying a boundary of the stitched region at which stitching occurs and a type indicator indicating whether the stitched region is one of: redundant and unique.

A sixth aspect of the disclosure provides a program product stored on a computer-readable medium, which when executed, modifies a complete integrated circuit (IC) chip layout, the program product comprising: program code for obtaining a circuit design for a complete integrated circuit (IC) chip layout at a first entity; program code for identifying a plurality of stitched regions of the complete IC chip layout at the first entity, the plurality of stitched regions including at least one redundant stitched region and at least one unique stitched region; and program code for modifying the complete IC chip layout to include for each stitched region: a boundary identification identifying a boundary of the stitched region at which stitching occurs and a type indicator indicating whether the stitched region is one of: redundant and unique.

A seventh aspect of the disclosure provides a computer-readable medium that includes computer program code to enable a computer infrastructure to aid in generating a photolithographic reticle and/or modifying a complete integrated circuit (IC) chip layout, the computer-readable medium comprising computer program code for performing the method steps of the disclosure.

An eighth aspect of the disclosure provides a business method for aiding in generating a photolithographic reticle and/or modifying a complete integrated circuit (IC) chip layout, the business method comprising managing a computer infrastructure that performs each of the steps of the disclosure; and receiving payment based on the managing step.

A ninth aspect of the disclosure provides a method of generating a system for aiding in generating a photolithographic reticle and/or modifying a complete integrated circuit (IC) chip layout, the method comprising: obtaining a computer infrastructure; and deploying means for performing each of the steps of the disclosure to the computer infrastructure.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

As indicated above, the disclosure provides stitched IC chip layout methods, systems and program products. More particularly, the disclosure provides mechanisms for aiding in the generation of a photolithographic reticle in a foundry and/or modifying a complete IC chip layout at a customer of the foundry. The disclosure enables the designing of a chip by a foundry customer such that a large IC chip can be easily checked as a whole as well as enabling the appropriate checks of the stitched regions.

Figure 1:
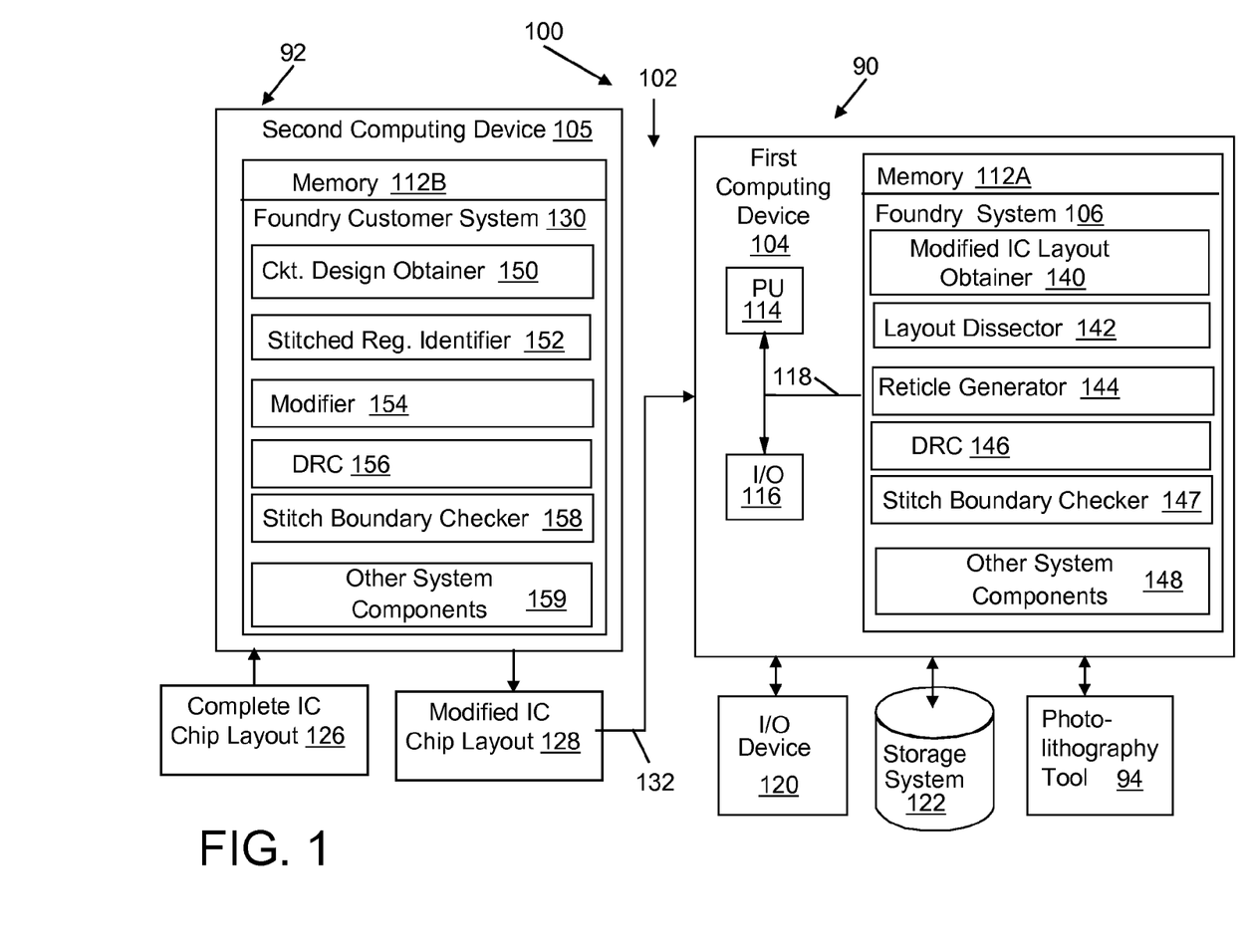
FIG. 1 shows embodiments of a computer infrastructure environment.

Turning to the drawings, FIG. 1 shows an illustrative environment 100 for aiding in the generation of a photolithographic reticle at a foundry 90 and/or modifying a complete integrated circuit (IC) chip layout 126 at a foundry customer 92. A foundry includes an integrated circuit (IC) chip fabrication site and a foundry customer may include any IC chip design entity. Foundry 90 includes at least one photolithography tool 94 (e.g., a Nikon DUV 4×, Nikon MUV 5×, Nikon MUV 2.5×, or ASML DUV 4× tool) used as part of the process of generating an IC chip.

Environment 100 includes a computer infrastructure 102 that can perform the various process steps described herein. In particular, computer infrastructure 102 is shown including a first computing device 104 that comprises a foundry system 106, which enables first computing device 104 to aid in generating a photolithographic reticle by performing the process steps of the disclosure. In addition, computer infrastructure 102 is shown including a second computing device 105 that includes a foundry customer system 130, which enables second computing device 105 to modify a complete integrated circuit (IC) chip layout 126 at foundry customer 92 by performing the process steps of the disclosure. It is understood that while the teachings of the disclosure will be described as though the entities employing first computing device 104 and second computing device 105 are separate, that may not be the case in all situations, e.g., foundry customer 92 may be internal of foundry 90.

First computing device 104 is shown including a memory 112A, a processor (PU) 114, an input/output (I/O) interface 116, and a bus 118. Further, first computing device 104 is shown in communication with an external I/O device/resource 120 and a storage system 122. As is known in the art, in general, processor 114 executes computer program code, such as foundry system 106, that is stored in memory 112A and/or storage system 122. While executing computer program code, processor 114 can read and/or write data, such as reticle data, to/from memory 112A, storage system 122, and/or I/O interface 116. Bus 118 provides a communications link between each of the components in first computing device 104. I/O device 116 can comprise any device that enables a user to interact with first computing device 104 or any device that enables first computing device 104 to communicate with one or more other computing devices. Input/output devices (including but not limited to keyboards, displays, pointing devices, etc.) can be coupled to the system either directly or through intervening I/O controllers.

In any event, first computing device 104 can comprise any general purpose computing article of manufacture capable of executing computer program code installed by a user (e.g., a personal computer, server, handheld device, etc.). However, it is understood that first computing device 104 and foundry system 106 are only representative of various possible equivalent computing devices that may perform the various process steps of the disclosure. To this extent, in other embodiments, first computing device 104 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the disclosure. For example, in one embodiment, computer infrastructure 102 comprises two or more computing devices (e.g., first and second computing devices 104, 105) that communicate over any type of wired and/or wireless communications link, such as a network, a shared memory, or the like, to perform the various process steps of the disclosure. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

As noted above, computer infrastructure 102 may comprise foundry customer system 130. Foundry customer system 130 is shown in communication with first computing device 104 over a communications link 132. As discussed above, communications link 132 can comprise any combination of various types of communications links as is known in the art. In one embodiment, foundry customer system 130 comprises second computing device 105 that is in communication with first computing device 104 over, for example, the Internet. It is understood that second computing device 105 can comprise the same components (processor, memory 112B, I/O interface, etc.) as shown for first computing device 104. These components have not been separately shown and discussed for brevity.

As previously mentioned and discussed further below, foundry system 106 enables computing infrastructure 102 to aid in generating a photolithography reticle. To this extent, foundry system 106 is shown including a modified IC layout obtainer 140, a layout dissector 142, a reticle generator 144, a design rule checker (DRC) 146, a stitch boundary checker 147 and other system components 148. Foundry customer system 130 is shown including a circuit design obtainer 150, a stitched region identifier 152, a modifier 154, a design rule checker 156, a stitch boundary checker 158 and other system components 159. Operation of each of these functions is discussed further below. However, it is understood that some of the various systems shown in FIG. 1 can be implemented independently, combined, and/or stored in memory for one or more separate computing devices that are included in computer infrastructure 102. Further, it is understood that some of the functionality may not be implemented, or additional functionality may be included as part of environment 100. In each system 106,130, other system components 148, 159 may include ancillary functions understood to those skilled in the art, e.g., communications systems, interface systems, etc.

Figure 2:
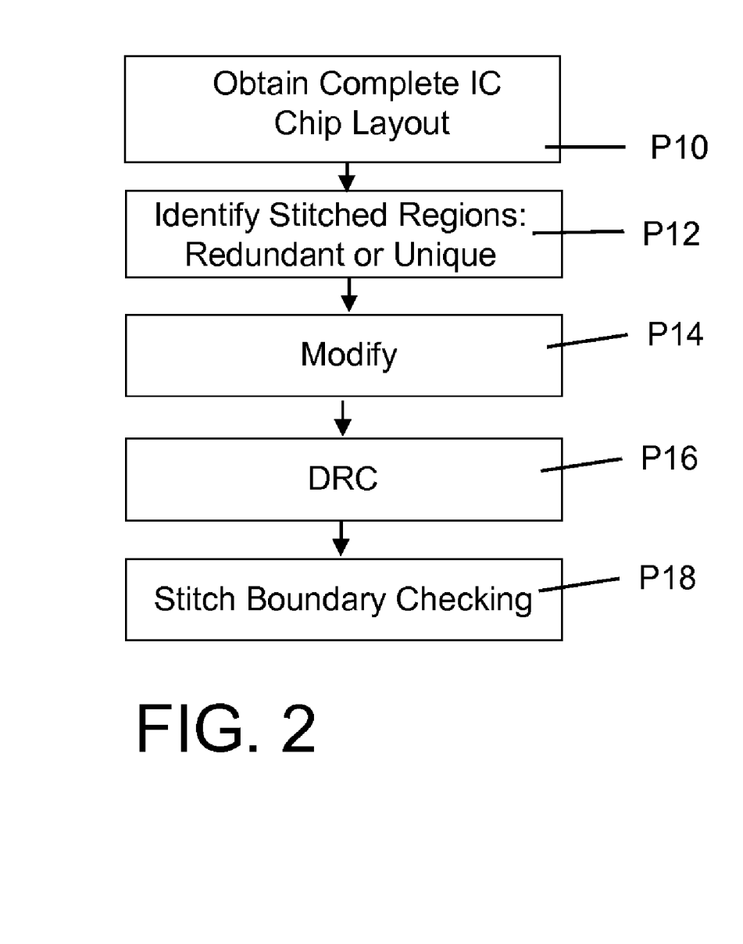
FIG. 2 shows embodiments of a method of modifying a complete IC chip layout.
Figure 4:
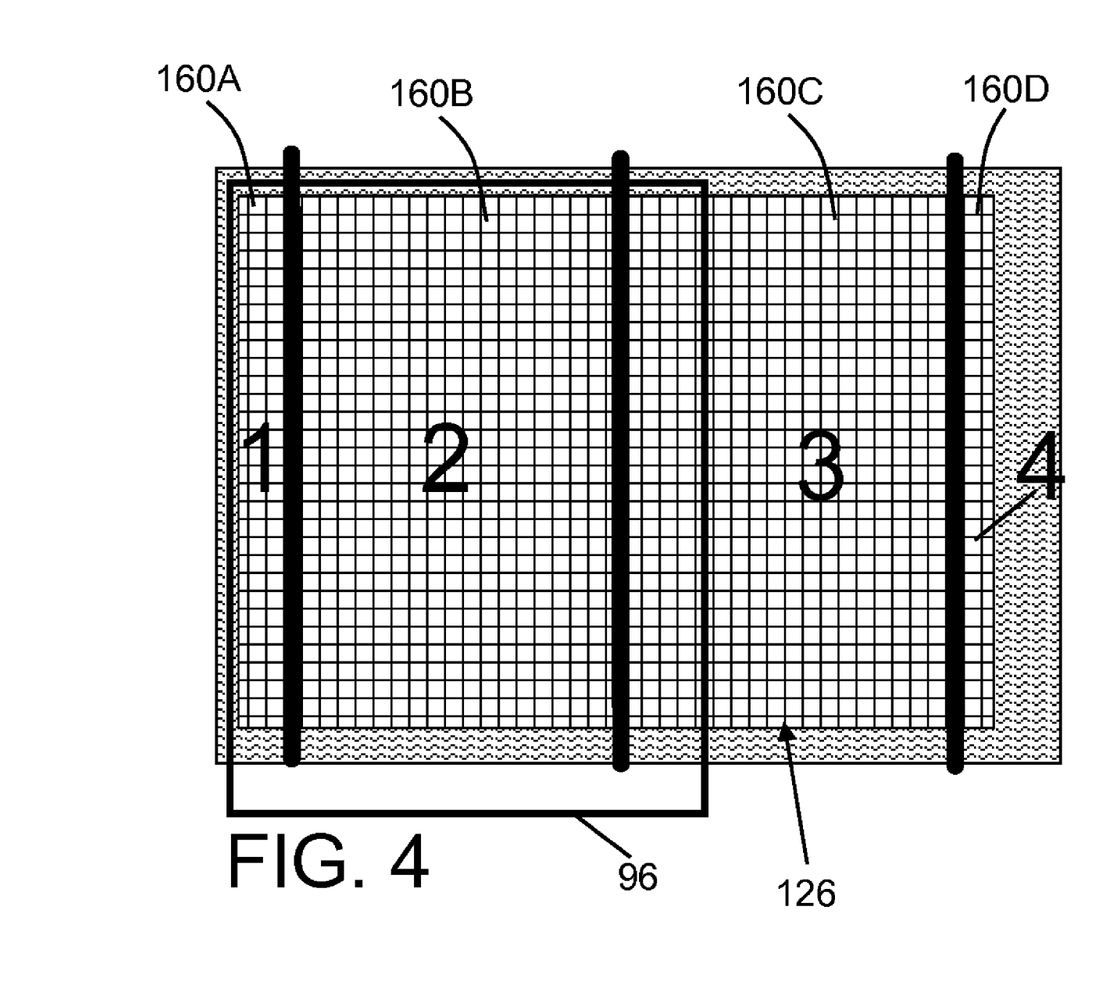
FIG. 4 shows embodiments of a complete IC chip layout that extends beyond a field of a photolithographic tool.

Turning to FIG. 2 in conjunction with FIG. 1, embodiments of a method of modifying complete IC chip layout 126 using foundry customer system 130 will now be described. Foundry customer system 130 may be provided to foundry customer 92 by foundry 90 such that the functions described herein can be completed by foundry customer 92. In process P10, circuit (ckt.) design obtainer 150 obtains a circuit design for complete integrated circuit (IC) chip layout 126 at foundry customer 92. As discussed herein, various systems and components are described as "obtaining" (e.g., circuit design obtainer 150, modified IC layout obtainer 140, etc.). It is understood that the corresponding data can be obtained using any solution. For example, the corresponding system/component can generate and/or be used to generate the data, retrieve the data from one or more data stores (e.g., a database), receive the data from another system/component (e.g., circuit design system of foundry customer system 130 and/or from foundry customer system 130), and/or the like. When the data is not generated by the particular system/component, it is understood that another system/component can be implemented apart from the system/component shown, which generates the data and provides it to the system/component and/or stores the data for access by the system/component. As used herein, "complete" indicates that IC chip layout 126 has all circuitry that will eventually be generated from the layout, and therefore, could be generated if photolithography tools having a sufficiently large field existed. However, as shown in FIG. 4, complete integrated circuit (IC) chip layout 126 exceeds a size of a field 96 of photolithography tool 94 (FIG. 1) at foundry 90 (FIG. 1). Hence, complete IC chip layout 126 cannot be fabricated as is.

Figure 5:
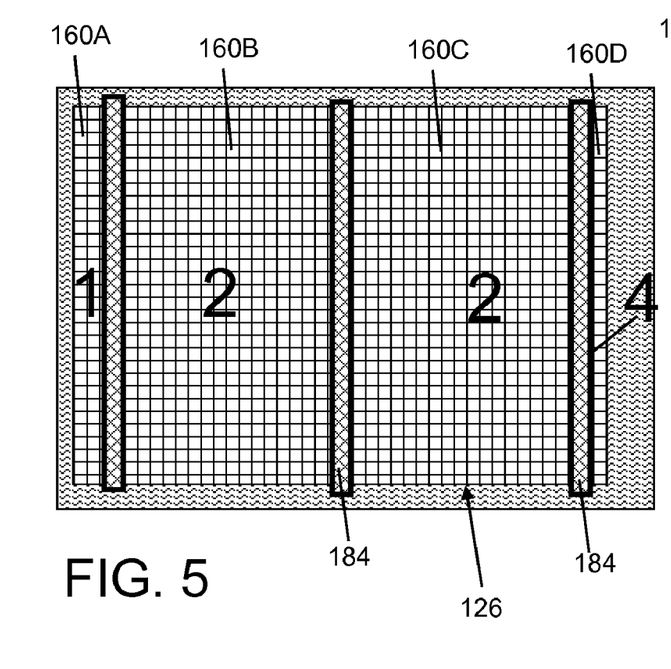
FIG. 5 shows embodiments of redundant portions of the complete IC chip layout of FIG. 4.
Figure 6:
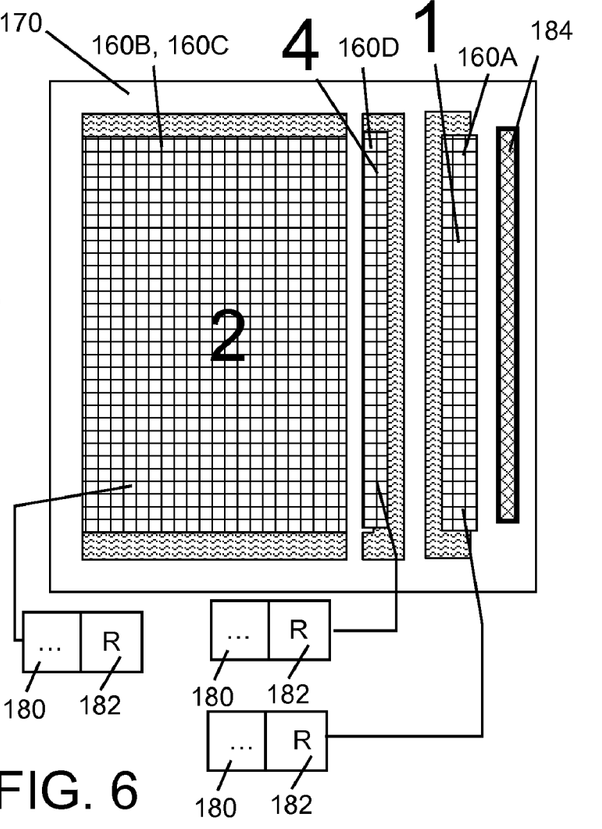
FIG. 6 shows embodiments of a modified IC chip layout on a photolithography reticle.

In process P12, stitched region (reg.) identifier 152 identifies a plurality of stitched regions 160A-D (FIG. 5) of complete IC chip layout 126 at foundry customer 92. As used herein, a "stitched region" is a portion of an IC layout that is segmented from an adjacent part of the IC layout on a photolithography reticle, and can be produced using the reticle such that the stitched region can be stitched together with the adjacent part to attain the relevant part of the original complete IC layout 126. As shown in FIGS. 4-5, plurality of stitched regions 160A-D include at least one redundant stitched region 160B-C (includes circuitry 2 and 3) and at least one unique stitched region 160A, 160D (circuitry 1 and 4). Restated, as shown in FIG. 5, regions 160B and 160C are actually identical (both include circuitry 2), and regions 160A, 160D are not identical to any other part and, hence, are unique. As such, as shown in FIG. 6, redundant regions 160B and 160C can be formed once in a photolithographic reticle 170 used to form stitched regions 160B, 160C. Unique stitched regions 160A and 160D are also formed individually on reticle 170. In another embodiment, complete IC chip layout 126 cannot be fabricated as is, but can be broken into multiple stitched regions and rearranged on reticle 170 to form all necessary regions without any redundant stitched regions being identified. For example, a long and narrow complete IC chip layout 126 exceeding the size of field 96 (FIG. 4) of photolithography tool 94 (FIG. 1) in only one direction and small enough in the other direction to fit the stitched regions that fall outside of the field of the photolithography tool into the tool field elsewhere, may be rearranged in that manner.

Figure 7:
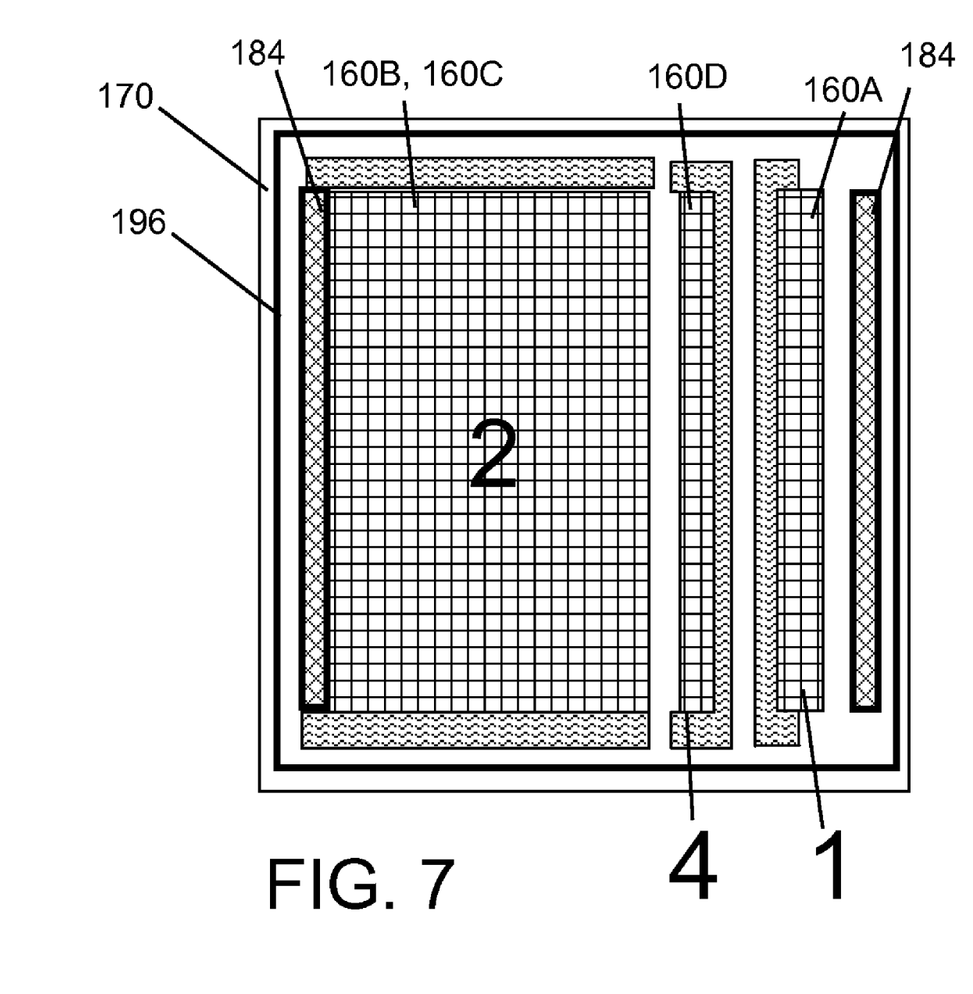
FIG. 7 shows embodiment of the modified IC chip layout of FIG. 6 compared to a field of a photolithography tool.

In process P14 (FIG. 2), modifier 154 (FIG. 1) modifies complete IC chip layout 126 to include, as shown in FIG. 6, for each stitched region 160A-D: a boundary identification 180 identifying a boundary of stitched region 160A-D at which stitching occurs and a type indicator 182 indicating whether stitched region 160A-D is redundant or unique. Boundary identification 180 may include but is not limited to a data set delineating x, y coordinate ranges identifying the boundary. Type indicator 182 may include, but is not limited to, some sort of indicator such as 'R' for redundant and 'U' for unique. Other forms for boundary identification 180 and/or type indicator 182 are also possible. In an optional embodiment, modifier 154 may also add a stitch boundary region 184 used for stitching at least two stitched regions (e.g., 160B, 160C) together. Stitch boundary region 184 may be provided as a separate entity (FIGS. 6 and 7) or incorporated into at least one of stitched regions 160A-D (FIG. 7, left side only; typically, stitched boundary region 184 would be provided in only one location.) In the latter case, stitched regions 160A-D would be formed in an overlap fashion such that stitched boundary region 184 would allow for mating structure. It is understood that different adjacent stitched regions 160A-D may require different structure for stitching together; accordingly, any number of stitched boundary regions 184 may be added by modifier 154. Stitched regions 160A-D and/or stitch boundary region 184 may be formed on photolithography reticle 170, which may be used to reproduce the entire complete IC chip layout 126. As shown in FIG. 7, all of the regions fit within a field 196 of a photolithography tool 94 (FIG. 1) at foundry 90.

In process P16, design rule checker (DRC) 156 (FIG. 1) performs design rule checking of now modified IC chip layout 128 in a single pass at foundry customer 92. DRC 156 may include any now known or later developed design rule checking system. The ability to complete design rule checking in a single pass at foundry customer 92, however, based on modified complete IC chip layout 128 allows a foundry customer 92 to significantly reduce the amount of data required to be checked since a stitched portion needs not be separately evaluated. In this regard, design services are done on the whole chip prior to break up, rather than on the separated pieces. This saves the foundry release team some work (i.e., the job is done once instead of 2-9 times). Note that cheese/fill processing (not shown) may also be provided after DRC (P16) and before dissection (P112).

In process P18, stitch boundary checker 158 (FIG. 1) performs stitch boundary checking of modified IC chip layout 128 in a single pass at foundry 90. Stitch boundary checker 158 evaluates modified IC chip layout 128 in a single pass for stitch boundary design conditions and rules (e.g., checks design shapes proximity to stitching boundary, such as design shapes space to stitching boundaries and design shapes overlap past stitching boundaries). The ability to complete the stitch boundary checking in a single pass at foundry customer 92 (FIG. 1) significantly reduces the amount of data required to be checked since each stitched region need not be separately evaluated. The single pass stitch boundary checking also allows for final evaluation and confirmation that the complete modified IC chip layout 128 satisfies all stitching boundary constraints.

Figure 3:
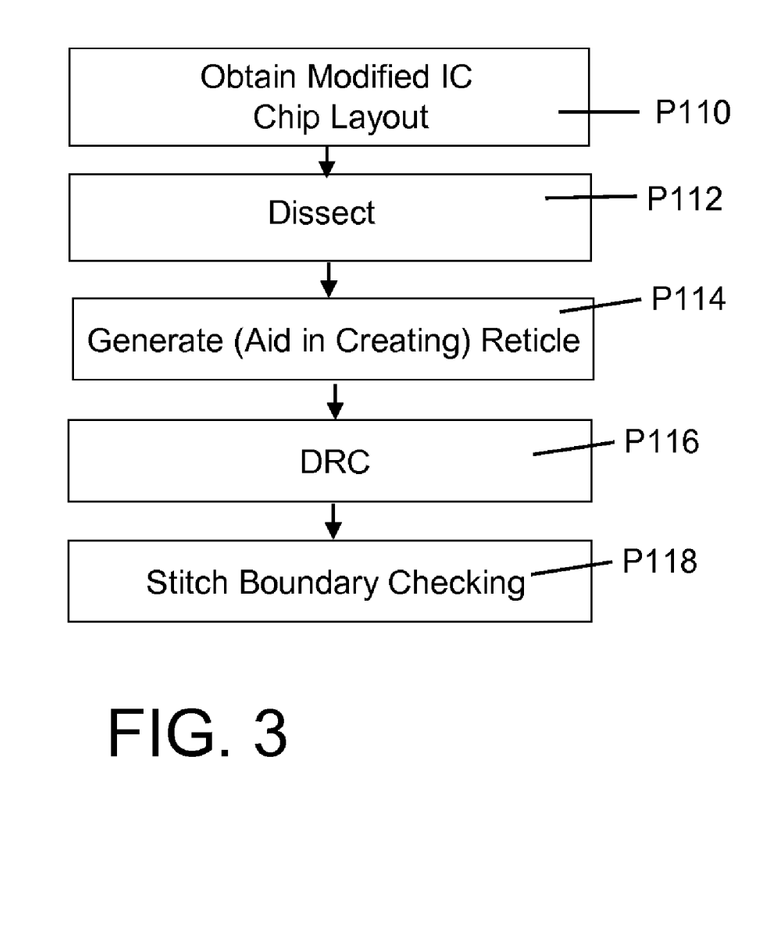
FIG. 3 shows embodiments of a method of aiding in generating a photolithographic reticle.

Referring to FIG. 3 in conjunction with FIG. 1, embodiments of a method of aiding in the generation of photolithography reticle 170 (FIGS. 6-7) using foundry system 106 will now be described. It is understood that other components (not shown) are used to ultimately generate reticle 170 (FIGS. 6-7), hence, foundry system 106 is stated to "aid" in generating reticle 170. These components are understood within the art, and generally are part of mask generation systems including mask writers and/or photolithography tool 94. In process P110, modified IC layout obtainer 140 obtains a circuit design for modified IC chip layout 128 from foundry customer 92. Modified IC chip layout 128 includes for at least one stitched region 160A-D (FIG. 6) of a plurality of stitched regions: boundary identification 180 (FIG. 6) identifying a boundary of the at least one stitched region 160A-D at which stitching occurs and type indicator 182 (FIG. 6) indicating whether the at least one stitched region 160A-D is redundant or unique. In addition, modified IC chip layout obtainer 140 may also obtain stitch boundary region 184 used for stitching at least two stitched regions 160A-D together. In some instances, stitch boundary region 184 may be contained within the adjacent stitched regions 160A-D, such that the stitched boundary region 184 is an overlapped region of a given width common with at least two adjacent stitched regions (FIG. 7). Stitched boundary regions 184 may be width compatible with photolithography tool 94 (FIG. 1) resolution capabilities and the design rule limits of the particular semiconductor technology (for example, but not limited to a width of 180 nm).

In process P112, layout dissector 142 dissects modified IC chip layout 128 into stitched regions 160A-D (FIG. 6) indicated as unique or redundant at foundry 90. In one embodiment, layout dissector 142 first identifies the stitch boundaries in modified IC chip layout 128 and then fractures the chip into its stitched regions 160A-D. Layout dissector 142 dissects the stitched regions that are unique and outputs them individually. Layout dissector 142 then identifies any redundant regions 160B-C and only outputs the minimum number of stitched regions that would be needed to construct the whole modified IC chip layout 128. The final output of layout dissector 142 is all of the unique stitched regions while any redundant regions are discarded.

In process P114, reticle generator 144 generates (or aids in generating) photolithographic reticle 170 (FIG. 7) at foundry 90 based on plurality of stitched regions 160A-D. In one embodiment, reticle generator 144 uses the output from layout dissector 142 to generate reticle 170. Reticle generator 144 places stitched regions 160A-D onto reticle 170 such that the reticle can be used in photolithography tool 94 to perform multiple exposures of the individual stitched regions 160A-D in order to stitch them back together and form complete IC chip layout 126 onto a substrate. Stitched regions 160A-D are orientated on reticle 170 in order to maximize the field available on reticle 170. Stitched regions 160A-D and stitch boundary region 184 have a size that fits within the size of photolithographic tool 94 field 196 (FIG. 7) at foundry 90. Stitched boundary region 184 may be generated by reticle generator 144 as separate (FIG. 6 or 7) or part of at least one stitched region 160A-D (FIG. 7 left side). In one embodiment, as described above and as shown in process P16 (FIG. 2), design rule checker (DRC) 156 at foundry customer 92 performs design rule checking of modified IC chip layout 128. However, in an alternative embodiment, as shown at process P116 (FIG. 3), design rule checker (DRC) 146 at foundry 90 may perform the same checking. In one embodiment, as described above and as shown in process P18 (FIG. 2), stitch boundary checker 158 performs stitch boundary checking of modified IC chip layout 128 in a single pass at foundry customer 92. However, in an alternative embodiment as shown in process P118 (FIG. 3), stitch boundary checker 147 performs stitch boundary checking of modified IC chip layout 128 in a single pass at foundry 90.

The above-described embodiments remove burdens from foundry customer 92 in that, normally, foundry customer 92 needs to run DRC on the whole complete IC chip layout 126 and each of stitched region 160A-D separately. Complicating this situation is that, conventionally, stitched regions 160A-D need to be checked slightly different than whole complete IC chip layout 126. The above-described embodiments, however, allow running of DRC on the whole modified IC chip layout 128, including stitched regions 160A-D, in a single pass, thus greatly reducing the amount of time to ready an IC chip layout for foundry 90. Using DRC 156 at foundry customer 92 to check whole chip designs at once for default rules as well as additional rules for appropriate stitching boundary conditions alleviates the need for foundry 90 to perform these steps. As a result, foundry customer system 130 (provided to foundry customer 92 by foundry 90) provides a more customer savvy and friendly system that eases the amount of time needed to design IC chips and minimizes complications and issues that could be associated with improper dissection of the large format IC chips. In addition, IC chip designers at foundry customer 90 can use boundary identifier 180 to identify the boundaries at which the stitching would occur, and/or type indicator 182 to indicate a stitched region 160A-D as either being redundant or unique. This functionality allows for dissecting modified IC chip layout 128 at foundry 90 while treating stitched boundary regions 184 appropriately for process concerns.

While the embodiments have been shown and described herein as methods and systems, it is understood that the disclosure further provides various alternative embodiments. That is, the disclosure can take the form of an entirely hardware embodiment, an entirely software embodiment or an embodiment containing both hardware and software elements. In a preferred embodiment, the disclosure is implemented in software, which includes but is not limited to firmware, resident software, microcode, etc. In one embodiment, the disclosure can take the form of a computer program product accessible from a computer-usable or computer-readable medium providing program code for use by or in connection with a computer or any instruction execution system, which when executed, enables a computer infrastructure to the above-described embodiments. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, such as memory 122, magnetic tape, a removable computer diskette, a random access memory (RAM), a read-only memory (ROM), a tape, a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processing unit 114 coupled directly or indirectly to memory elements through a system bus 118. The memory elements can include local memory, e.g., memory 112A, employed during actual execution of the program code, bulk storage (e.g., memory system 122), and cache memories which provide temporary storage of at least some program code in order to reduce the number of times code must be retrieved from bulk storage during execution.

In another embodiment, the disclosure provides a method of generating a system for aiding in generating a photolithographic reticle and/or modifying a complete integrated circuit (IC) chip layout. In this case, a computer infrastructure, such as computer infrastructure 102 (FIG. 1), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing device 104 and/or 105 (FIG. 1), from a computer-readable medium; (2) adding one or more computing devices to the computer infrastructure; and (3) incorporating and/or modifying one or more existing systems of the computer infrastructure, to enable the computer infrastructure to perform the process steps of the disclosure.

In still another embodiment, the disclosure provides a business method that performs the process described herein on a subscription, advertising, and/or fee basis. That is, a service provider, such as a foundry, could offer to aid in generating a photolithographic reticle and/or modify a complete integrated circuit (IC) chip layout as described herein. In this case, the service provider can manage (e.g., create, maintain, support, etc.) a computer infrastructure, such as computer infrastructure 102 (FIG. 1) or parts thereof, that performs the processes described herein for one or more customers. In return, the service provider can receive payment from the customer(s) under a subscription and/or fee agreement, receive payment from the sale of advertising to one or more third parties, and/or the like.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like. Further, it is understood that the terms "component" and "system" are synonymous as used herein and represent any combination of hardware and/or software capable of performing some function(s).

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method, performed on at least one computing device, the method comprising:
    obtaining from a first entity, using the at least one computing device, a circuit design for an integrated circuit (IC) chip layout that exceeds a size of a photolithography tool field at a second entity, wherein the IC chip layout comprises a plurality of stitched regions, wherein at least one stitched region includes: a boundary identification identifying a boundary of the at least one stitched region at which stitching occurs and a type indicator indicating whether the at least one stitched region is one of: redundant and unique;
    dissecting, using the at least one computing device, the IC chip layout into stitched regions indicated as unique or redundant at the second entity; and
    generating, using the at least one computing device, a photolithographic reticle at the second entity based on the plurality of stitched regions, the photolithographic reticle having a size that fits within the size of the photolithography tool field at the second entity.

2. The method of claim 1, further comprising performing, using the at least one computing device, design rule checking of the IC chip layout in a single pass at the first entity.

3. The method of claim 2, further comprising performing, using the at least one computing device, stitch boundary checking of the IC chip layout in a single pass at the first entity.

4. The method of claim 1, wherein the second entity includes an IC chip foundry and the first entity includes a customer of the foundry.

5. The method of claim 1, wherein the obtaining further includes obtaining a stitch boundary region used for stitching at least two stitched regions together.

6. The method of claim 5, wherein the generating includes generating the stitch boundary region incorporated into at least one of the stitched regions on the photolithographic reticle.

7. A system comprising:
- means for obtaining from a foundry customer a circuit design for an integrated circuit (IC) chip layout that exceeds a size of a photolithography tool field at a foundry, wherein the IC chip layout comprises a plurality of stitched regions, wherein at least one stitched region includes: a boundary identification identifying a boundary of the at least one stitched region at which stitching occurs and a type indicator indicating whether the at least one stitched region is one of: redundant and unique;
- means for dissecting the IC chip layout into stitched regions indicated as unique or redundant at the foundry; and
- means for generating a photolithographic reticle at the foundry based on the plurality of stitched regions, the photolithographic reticle having a size that fits within the size of the photolithography tool field at the foundry.

8. The system of claim 7, wherein the obtaining means further obtains a stitch boundary region used for stitching at least two stitched regions together.

9. The system of claim 8, wherein the generating means generates the stitch boundary region incorporated into at least one of the stitched regions on the photolithographic reticle.

10. A computer program product stored on a computer-readable medium, which when executed by a computer, aids in generating a photolithographic reticle, the program product comprising:
- program code for obtaining from a foundry customer a circuit design for an integrated circuit (IC) chip layout that exceeds a size of a photolithography tool field at a foundry, wherein the IC chip layout includes for at least one stitched region of a plurality of stitched regions: a boundary identification identifying a boundary of the at least one stitched region at which stitching occurs and a type indicator indicating whether the at least one stitched region is one of: redundant and unique;
- program code for dissecting the IC chip layout into stitched regions indicated as unique or redundant at the foundry; and
- program code for generating a photolithography reticle at the foundry based on the plurality of stitched regions, the photolithographic reticle having a size that fits within the size of the photolithographic tool field at the foundry.

11. The computer program product of claim 9, wherein the obtaining program code further obtains a stitch boundary region used for stitching at least two stitched regions together.

12. The computer program product of claim 11, wherein the generating program codes generates the stitch boundary region incorporated into at least one of the stitched regions on the photolithographic reticle.

13. A method, performed on at least one computing device, the method comprising:
- obtaining a circuit design for a complete integrated circuit (IC) chip layout at a first entity, using the at least one computing device, the completed IC chip layout exceeding a size of a photolithography tool field at a foundry;
- identifying, using the at least one computing device, a plurality of stitched regions of the complete IC chip layout at the first entity, the plurality of stitched regions including at least one redundant stitched region and at least one unique stitched region; and
- modifying, using the at least one computing device, the complete IC chip layout to include for each stitched region: a boundary identification identifying a boundary of the stitched region at which stitching occurs and a type indicator indicating whether the stitched region is one of: redundant and unique.

14. The method of claim 13, further comprising performing, using the at least one computing device, design rule checking of the modified complete IC chip layout in a single pass at the first entity.

15. The method of claim 13, further comprising performing, using the at least one computing device, stitch boundary checking of the modified complete IC chip layout in a single pass at the first entity.

16. The method of claim 13, wherein the modifying further include adding a stitch boundary region used for stitching at least two stitched regions together.

* * * * *